United States Patent [19]

Takayanagi

[11] Patent Number: 5,210,236
[45] Date of Patent: May 11, 1993

[54] DIFFERENTIAL AMPLIFIER

[75] Inventor: Toshinari Takayanagi, Yokohama, Japan

[73] Assignee: Kabushiki Kaisha Toshiba, Kawasaki, Japan

[21] Appl. No.: 762,752

[22] Filed: Sep. 20, 1991

[30] Foreign Application Priority Data

Sep. 21, 1990 [JP] Japan .................................. 2-250375

[51] Int. Cl.$^5$ ............................................. H03F 3/45
[52] U.S. Cl. ....................................... 330/253; 330/9
[58] Field of Search .................. 330/9, 252, 253, 258, 330/261, 277

[56] References Cited

U.S. PATENT DOCUMENTS 4,586,166  4/1986  Shah ...................................... 365/154
5,098,789  2/1992  Van Tran .............................. 330/253

FOREIGN PATENT DOCUMENTS 2-41115  9/1990  Japan.

*Primary Examiner*—Steven Mottola
*Attorney, Agent, or Firm*—Foley & Lardner

[57] ABSTRACT

A differential amplifier has a pair of inputs and a pair of outputs. Each of the outputs is connected between a high potential source and a low potential source through a pair of FETs, respectively. These FETs have the same conduction type. A gate of one of the FETs is connected to one of the inputs, and a gate of the other FET is connected to the other input. This arrangement suppresses output offset and realizes a wide sensitivity range.

14 Claims, 8 Drawing Sheets

DIFFERENTIAL AMPLIFIER

BACKGROUND OF THE INVENTION

1. Field of the Invention

The present invention relates to a differential amplifier made of a semiconductor material and particularly to a differential amplifier having a wide sensitivity range.

2. Description of the Prior Art

FIG. 1 is a circuit diagram showing a differential amplifier according to a first embodiment of the prior art. FIG. 2 is a circuit diagram showing a simplified circuit of the differential amplifier of FIG. 1. FIG. 3 shows voltage-current characteristic curves of the circuit of FIG. 2.

FIG. 4 is a circuit diagram showing a differential amplifier according to a second embodiment of the prior art. FIG. 5 a circuit diagram showing a simplified circuit of the differential amplifier of FIG. 4. FIG. 6 shows voltage-current characteristic curves of the circuit FIG. 5.

The differential amplifier of the first prior art embodiment of FIGS. 1 to 3 will be explained.

In FIG. 1, MOSFETs Q1 and Q4 form a pair of inverters, and MOSFETs Q2 and Q5 another pair of inverters. A MOSFET Q3 is a constant current MOSFET. For the sake of simplicity of explanation, the MOSFET Q3 of FIG. 1 is removed in FIG. 2 with reference to which a differential gain and an offset of the differential amplifier of the first prior art embodiment will be explained.

When a voltage V0 is applied to input terminals IN1 and IN2 in FIG. 2, an operating point of the differential amplifier will be a point M in FIG. 3.

When ±ΔV is applied to the input terminals IN1 and IN2, output terminals OUT1 and OUT2 provide a potential difference represented with points L and H in FIG. 3. This potential difference is called the differential gain.

When a voltage of V0+ΔV is applied to the input terminals IN1 and IN2, a voltage at each of the output terminals OUT1 and OUT2 shifts from the operating point M to an operating point M'. When a voltage of V0−ΔV is applied to the input terminals IN1 and IN2, a voltage at each of the output terminals OUT1 and OUT2 shifts from the operating point M to an operating point M''. This is called the offset, which indicates a shift of the operating point.

In this way, according to the differential amplifier of the first prior art embodiment, an increase in the differential offset inevitably accompanies an increase in the gain, so that this differential amplifier achieves a narrow sensitivity range.

The differential amplifier of the second prior art embodiment will be explained with reference to FIGS. 4 to 6.

In FIG. 4, MOSFETs Q1 and Q4 form a pair of inverters, and MOSFETs Q2 and Q5 form another pair of inverters. Each pair of the inverters has a CMOS configuration. For the sake of simplicity of explanation, a MOSFET Q3 of FIG. 4 is removed in FIG. 5 with reference to which a principle of the second prior art embodiment will be explained.

When a voltage V0 is applied to input terminals IN1 and IN2 in FIG. 5, an operating point of the differential amplifier will be a point M in FIG. 6.

When ±ΔV is applied to the input terminals IN1 and IN2, output terminals OUT1 and OUT2 provide a potential difference represented with points L and H in FIG. 3. This potential difference is the differential output.

When the input voltage is changed from V0 to V0+ΔV, the operating point is shifted to a point M', and when the input voltage is changed to V0−ΔV, the operating point is shifted to a point M''.

Since the differential amplifier of the second prior art embodiment has the inverter pairs of CMOS configuration, it may provide a large differential gain but with a large offset. Namely, this differential amplifier achieves a very narrow sensitivity range.

In this way, the conventional differential amplifiers may provide a large differential gain but with a large offset which drastically narrows a sensitivity range of the amplifiers.

SUMMARY OF THE INVENTION

An object of the present invention is to provide a differential amplifier having a wide sensitivity range.

Another object of the present invention is to provide a differential amplifier having a large differential gain and a small offset.

In order to accomplish the objects, the present invention provides a differential amplifier comprising first and second different potential sources, a first output terminal connected to the first potential source through a first FET and to the second potential source through a second FET, the first and second FETs having the same conduction type, a second output terminal connected to the first potential source through a third FET and to the second potential source through a fourth FET, the third and fourth FETs having the same conduction types, a first input terminal connected to gates of the first and fourth FETs, and a second input terminal connected to gates of the second and third FETs.

In this arrangement, all of the FETs may have the same conduction type, so that the arrangement may be formed in a small area on a semiconductor chip.

These and other objects, features and advantages of the present invention will be more apparent from the following detailed description of preferred embodiments in conjunction with the accompanying drawings.

DETAILED DESCRIPTION OF THE EMBODIMENTS

Figure 1:
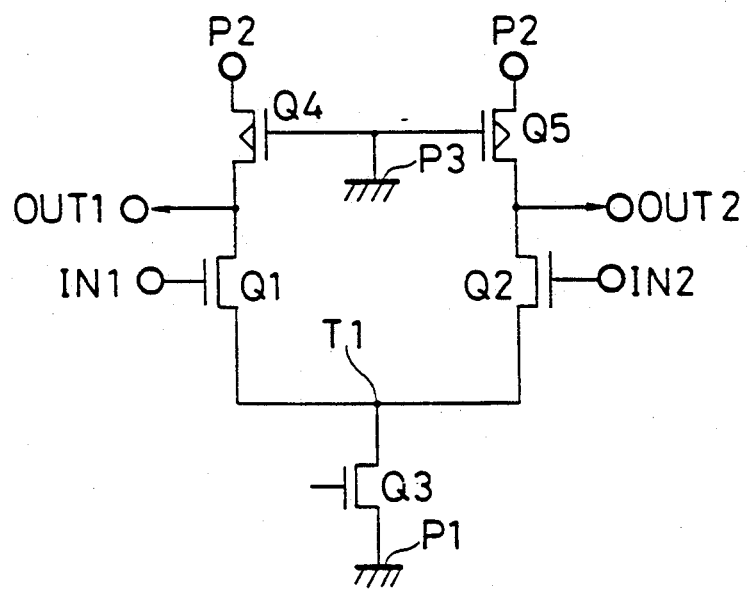
FIG. 1 is a circuit diagram showing a differential amplifier according to a first prior art embodiment.
Figure 2:
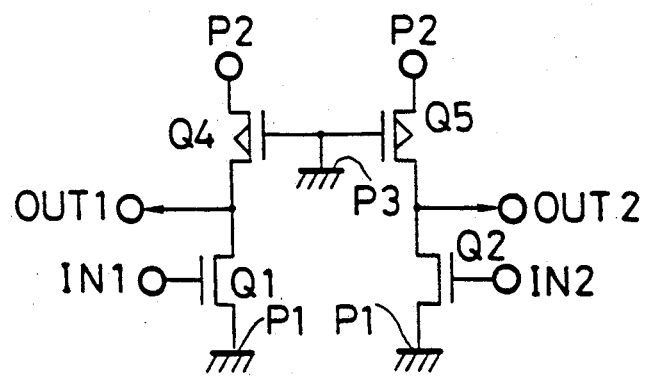
FIG. 2 is a circuit diagram showing a simplified circuit of the differential amplifier of FIG. 1.
Figure 3:
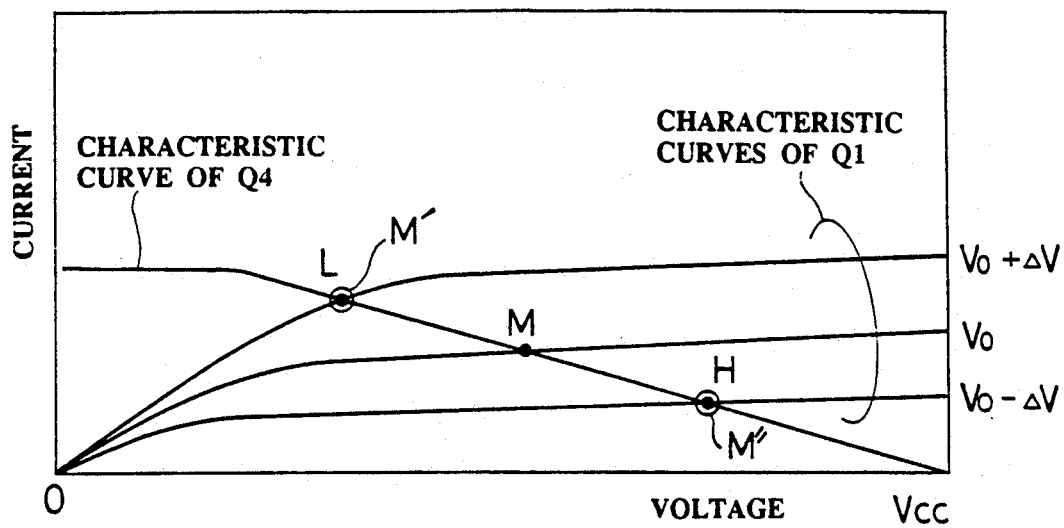
FIG. 3 is a graph showing voltage-current characteristic curves of the circuit of FIG. 2.
Figure 4:
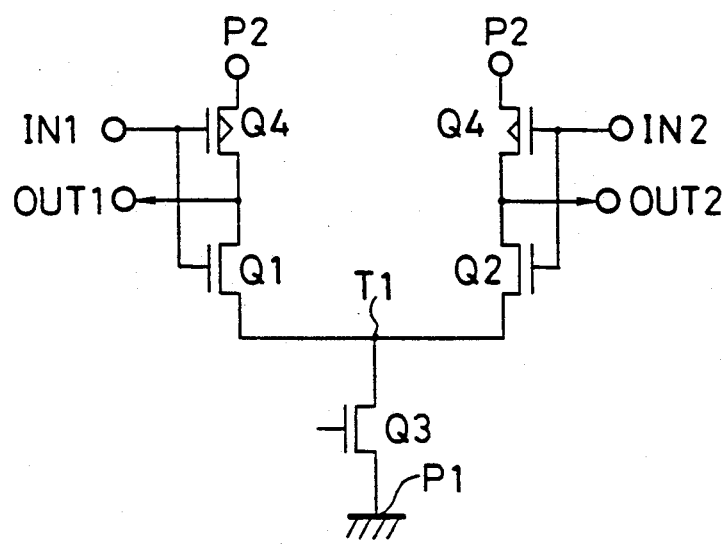
FIG. 4 is a circuit diagram showing a differential amplifier according to a second prior art embodiment.
Figure 5:
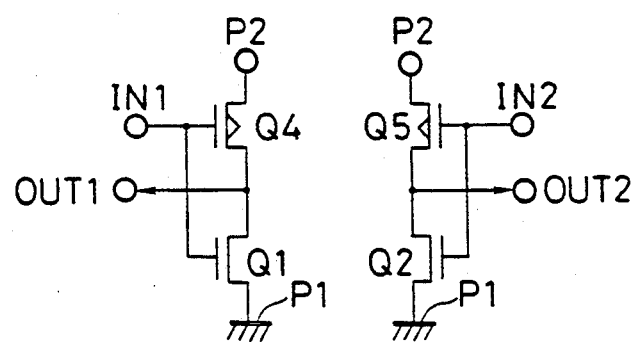
FIG. 5 is a circuit diagram showing a simplified circuit of the differential amplifier of FIG. 4.
Figure 6:
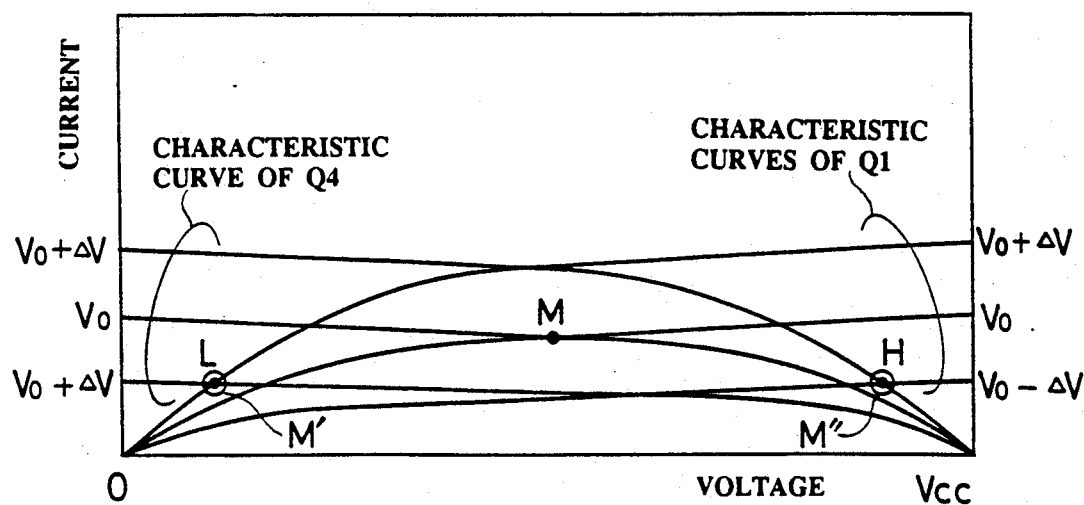
FIG. 6 is a graph showing voltage-current characteristic curves of the circuit of FIG. 5.
Figure 7:
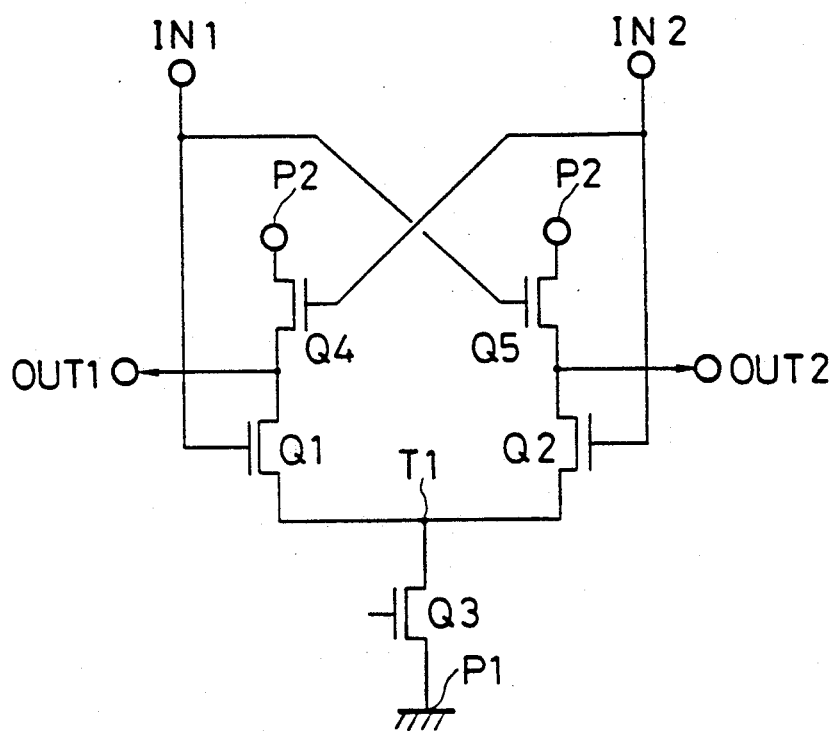
FIG. 7 is a circuit diagram showing a differential amplifier according to a first embodiment of the invention.

FIG. 7 shows a differential amplifier according to the first basic embodiment of the invention.

This differential amplifier comprises a first MOSFET Q1 having a drain connected to a first output terminal OUT1, a gate connected to a first input terminal IN1 and a source connected to a first node T1; a second MOSFET Q2 having a drain connected to a second output terminal OUT2, a gate connected to a second input terminal IN2 and a source connected to the first node T1; a current controlling third MOSFET Q3 having a drain connected to the first node T1 and a source connected to a first power source P1; a fourth load MOSFET Q4 having a drain connected to a second power source P2, a gate connected to the second input terminal IN2 and a source connected to the first output terminal OUT1; and a fifth load MOSFET Q5 having a drain connected to the second power source P2, a gate connected to the first input terminal IN1 and a source connected to the second output terminal OUT2.

The first through fifth MOSFETs Q5 have the same conduction type, the first and second MOSFETs Q1 and Q2 have the same dimensions, and the fourth and fifth MOSFETs have the same dimensions. All of the FETs are enhancement FETs.

Figure 8:
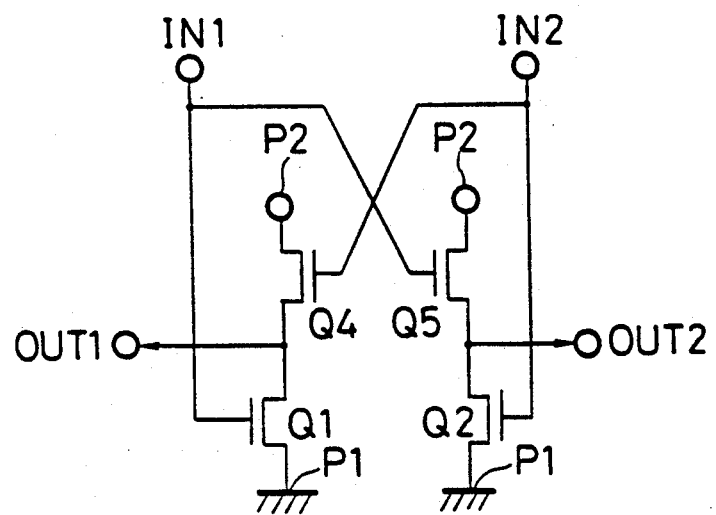
FIG. 8 is a circuit diagram showing a simplified circuit of the differential amplifier of FIG. 7.
Figure 9:
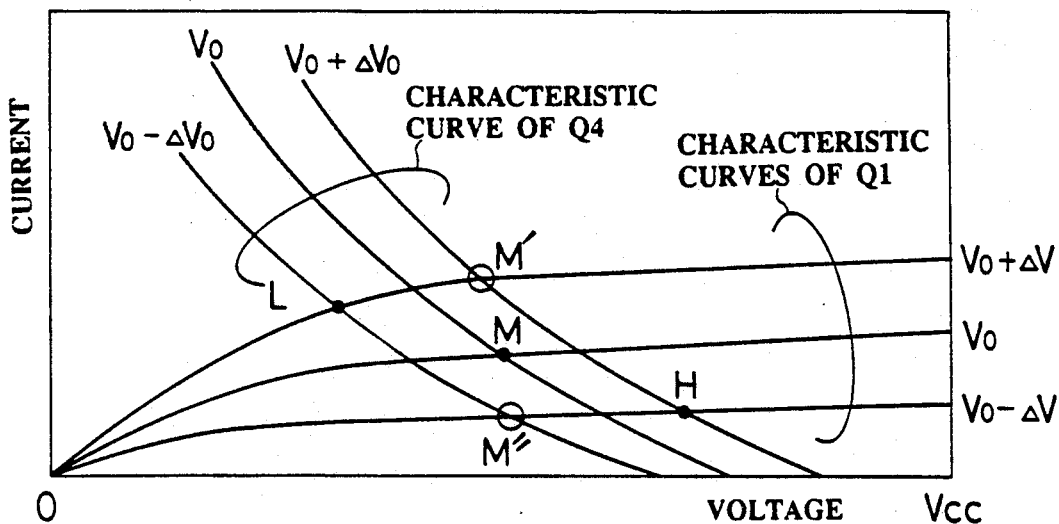
FIG. 9 is a graph showing voltage-current characteristic curves of the circuit of FIG. 8.

An operation of the differential amplifier of FIG. 7 will be explained with reference to FIGS. 8 and 9, in which FIG. 8 has no constant current MOSFET Q3 of FIG. 7 for the sake of simplicity of explanation, and FIG. 9 shows voltage-current characteristic curves of the circuit of FIG. 8.

When a voltage V0 is applied to the input terminals IN1 and IN2, the operating point of the differential amplifier will be point M in FIG. 9.

When a voltage difference of $\pm \Delta V$ is applied to the input terminals IN1 and IN2, current characteristics of the driver MOSFET Q1 and of the load MOSFET Q4 change, so that the output terminals OUT1 and OUT2 provide a potential difference represented with points L and H in FIG. 9. This potential difference is a differential gain.

When the voltage applied to the input terminals IN1 and IN2 changes from V0 to $V0+\Delta V$, the operating point shifts from M to M', and when the applied voltage changes to $V0-\Delta V$, the operating point shifts to M".

This is an offset. As is apparent from FIG. 9, this offset is suppressed to a very small value.

In this way, the differential amplifier of this embodiment has a large differential gain and a very small offset. Since the MOSFETs Q1 through Q5 have the same conduction type, they may be formed in a small area in the same well.

Figure 10:
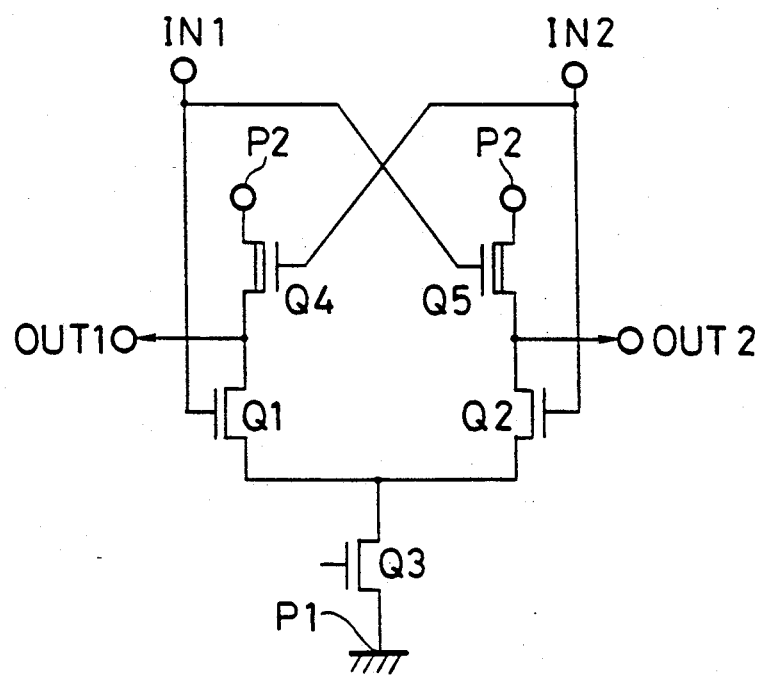
FIG. 10 is a circuit diagram showing a differential amplifier according to a second embodiment of the invention.

FIG. 10 shows a differential amplifier according to the second embodiment of the invention, with load MOSFETs Q4 and Q5 being n-channel depletion MOSFETs. Compared with enhancement MOSFETs, the depletion MOSFETs Q4 and Q5 increase an upper limit of an output voltage.

The embodiments only show basic arrangements. It is possible to arrange load MOSFETs between the second power source P2 and the MOSFETs Q4 and Q5, between the MOSFETs Q4 and Q1, between the MOSFETs Q5 and Q2, or between the MOSFET Q3 and the first power source P1 in series.

Figure 11:
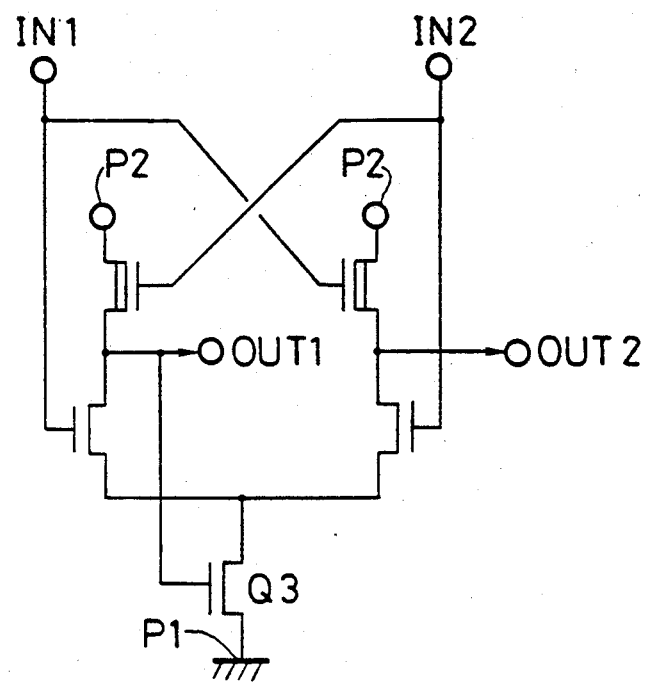
FIG. 11 is a circuit diagram showing a differential amplifier according to a third embodiment of the invention.

FIG. 11 shows a differential amplifier according to the third embodiment of the invention, in which an output terminal OUT1 is fed back to a MOSFET Q3, thereby further reducing the offset.

Figure 12:
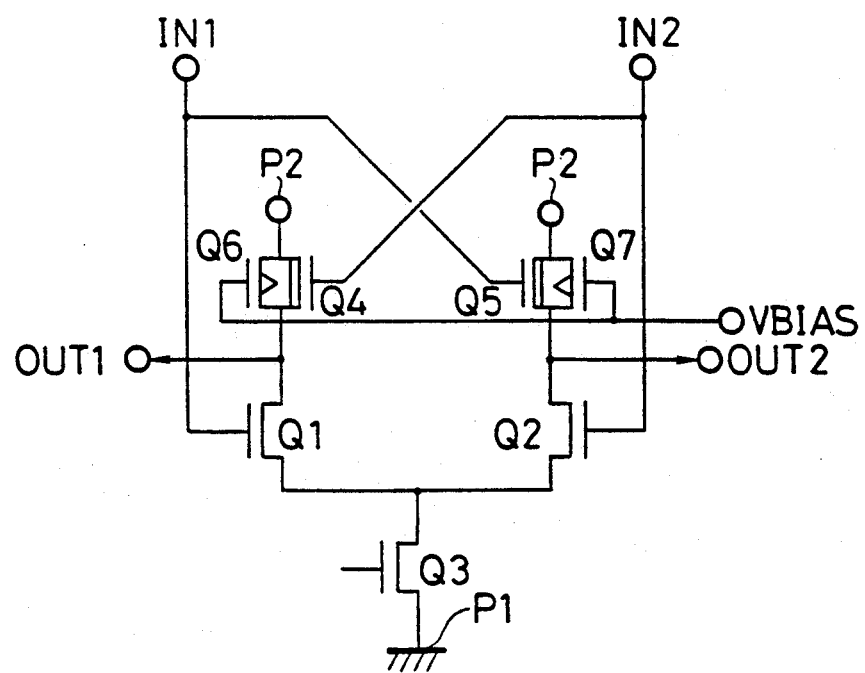
FIG. 12 is a circuit diagram showing a differential amplifier according to a fourth embodiment of the invention.

FIG. 12 shows a differential amplifier according to the fourth embodiment of the invention, in which properly biased resistance load PMOSFETs Q6 and Q7 are connected to MOSFETs Q4 and Q5 in parallel, respectively, to increase an upper limit voltage of output terminals OUT1 and OUT2 to the voltage of a second power source P2.

Figure 13:
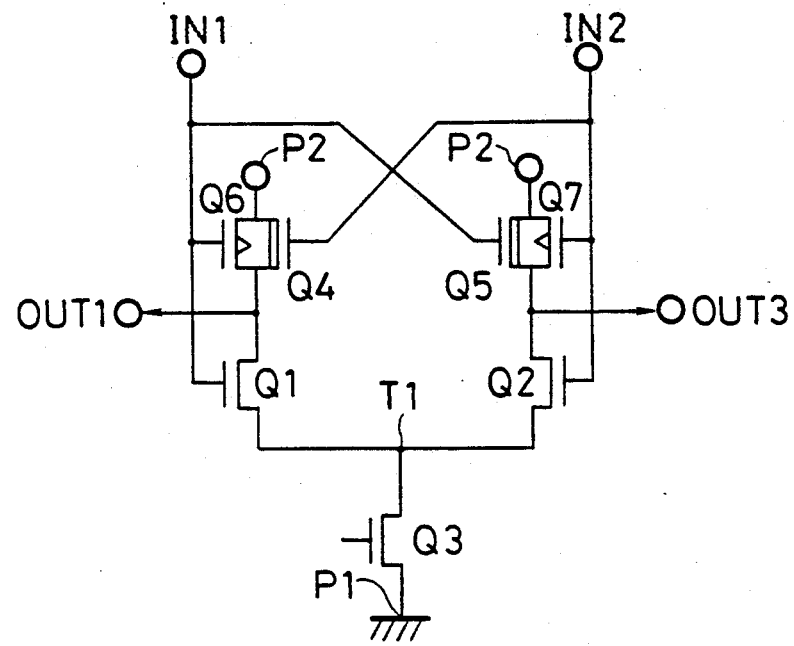
FIG. 13 is a circuit diagram showing a differential amplifier according to a fifth embodiment of the invention.

FIG. 13 shows a differential amplifier according to the fifth embodiment of the invention, in which PMOSFETs Q6 and Q7 forming CMOS configurations with MOSFETs Q1 and Q2 are connected to MOSFETs Q4 and Q5 in parallel, respectively, to further increase the differential gain.

Figure 14:
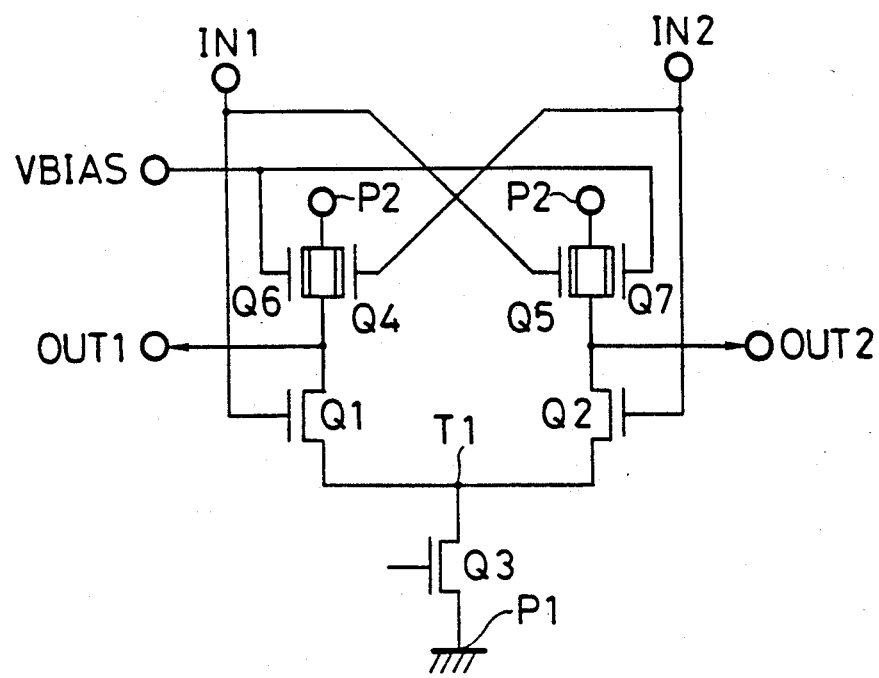
FIG. 14 is a circuit diagram showing a differential amplifier according to a sixth embodiment of the invention.

FIG. 14 shows a differential amplifier according to the sixth embodiment of the invention, in which properly biased resistance load NMOSFETs Q6 and Q7 are connected to MOSFETs Q4 and Q5 in parallel, respectively.

Figure 15:
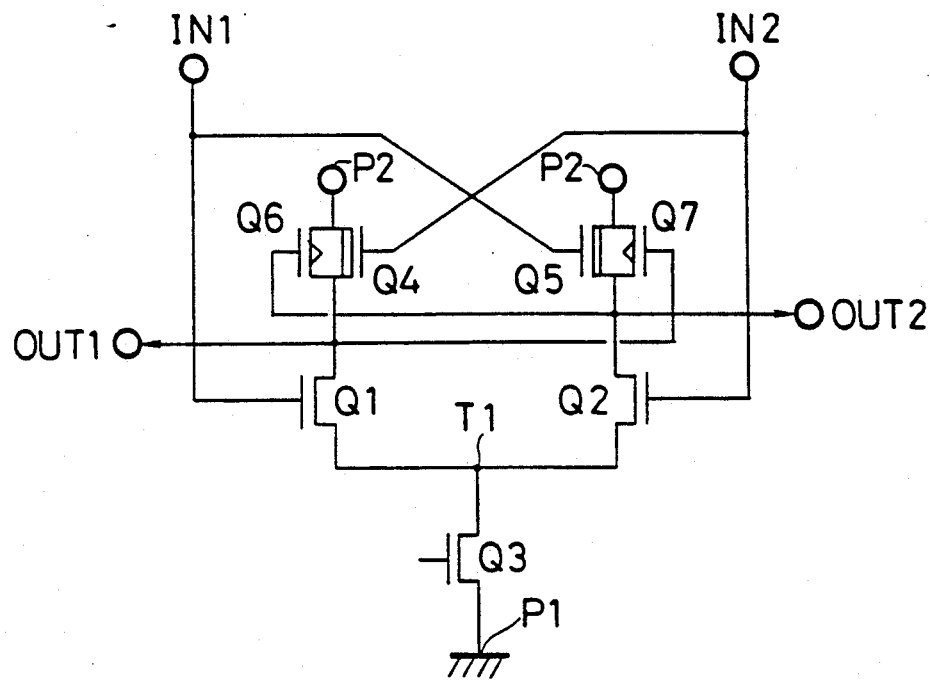
FIG. 15 is a circuit diagram showing a differential amplifier according to a seventh embodiment of the invention.

FIG. 15 shows a differential amplifier according to the seventh embodiment of the invention, in which PMOSFETs Q6 and Q7 are positively fed back from opposite output terminals OUT2 and OUT1, respectively, and connected to MOSFETs Q4 and Q5 in parallel, respectively.

Figure 16:
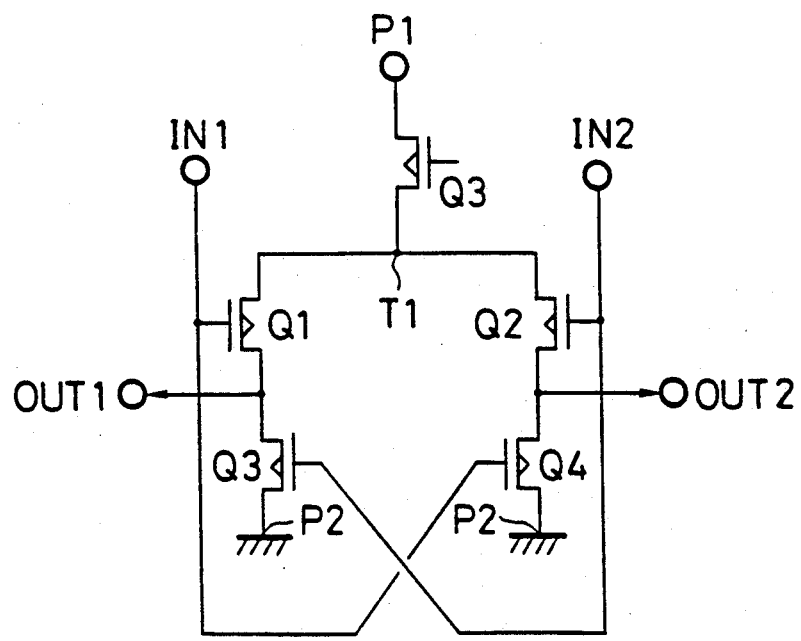
FIG. 16 is a circuit diagram showing a differential amplifier according to an eighth embodiment of the invention.

In the embodiments shown in FIGS. 10 to 15, the driver MOSFETs Q1 and Q2 are NMOSFETs. According to the invention, it is possible to analogically invert the PMOSFETs and NMOSFETs of each of the embodiments. An example of this is shown in FIG. 16, in which, contrary to FIG. 10, a common power source P1 is connected to a constant current MOSFET Q3.

In summary, the present invention provides a differential amplifier achieving a large differential gain and a small offset, i.e., a wide sensitivity range. Since driver MOSFETs and load MOSFETs of the differential amplifier of the invention have the same conduction type, these MOSFETs may be formed in a small area in the same well.

Various modifications will become possible for those skilled in the art after receiving the teachings of the present disclosure without departing from the scope thereof.

What is claimed is:

1. A differential amplifier comprising:
   a first potential source;

a second potential source;
a first FET connected to said first potential source;
a second FET connected to said second potential source;
a third FET connected to said first potential source;
a fourth FET connected to said second potential source;
a first output terminal connected directly to a junction between said first and second FETs;
a second output terminal connected directly to a junction between said third and fourth FETs;
a first input terminal connected to gates of the first and fourth FETs; and
a second input terminal connected to gates of the second and third FETs,
wherein an ON state at said second FET is weakened and an ON state at said fourth FET is strengthened when a high potential and a low potential are loaded in said first input terminal and said second input terminal, respectively, so that a current flows from said second potential source to said second output terminal, thus increasing an amplifying efficiency of said differential amplifier.

2. The differential amplifier according to claim 1, wherein the first and third FETs are connected to said first potential source through a constant current source.

3. The differential amplifier according to claim 2, wherein the constant current source is a fifth FET.

4. The differential amplifier according to claim 1, wherein the first, second, third and fourth FETs have the same conduction type.

5. The differential amplifier according to claim 4, wherein the first, second, third and fourth FETs are of n type, and said second potential source provides a higher potential than said first potential source.

6. The differential amplifier according to claim 3, wherein the second and fourth FETs are depletion FETs, and the first and third FETs are enhancement FETs.

7. A differential amplifier comprising:
a first potential source;
a second potential source providing a higher potential than said first potential source;
a first N-type FET connected to said first potential source through a constant current source;
a second N-type FET connected to said second potential source;
a third N-type FET connected to said first potential source through said constant current source;
a fourth N-type FET connected to said second potential source;
a fifth FET which serves as said constant current source;
a first output terminal connected to a gate of said fifth FET;
a second output terminal connected directly to a junction between said third and fourth N-type FETs;
a first input terminal connected to gates of said first and fourth FETs; and
a second input terminal connected to gates of said second and third FETs,
wherein said second and fourth FETs are depletion FETs, and said first and third FETs are enhancement FETs.

8. The differential amplifier according to claim 7, further comprising sixth and seventh FETs connected to the second and fourth FETs in parallel, respectively, the conduction type of the sixth and seventh FETs being opposite to that of the second and fourth FETs.

9. The differential amplifier according to claim 8, wherein a predetermined bias potential is applied to gates of the sixth and seventh FETs.

10. The differential amplifier according to claim 8, wherein a gate of the sixth FET is connected to said first input terminal, and a gate of the seventh FET is connected to said second input terminal.

11. The differential amplifier according to claim 8, wherein a gate of the sixth FET is connected to said second output terminal, and a gate of the seventh FET is connected to said first output terminal.

12. The differential amplifier according to claim 7, further comprising eighth and ninth depletion FETs connected to the second and fourth FETs in parallel, respectively, the eighth and ninth FETs having the same conduction type as that of the second and fourth FETs.

13. The differential amplifier according to claim 12, wherein a predetermined bias potential is applied to gates of the eighth and ninth FETs.

14. The differential amplifier according to claim 12, wherein a gate of the eighth FET is connected to said first input terminal, and a gate of the ninth FET is connected to said second input terminal.

* * * * *